US011157028B1

(12) United States Patent
Lundberg

(10) Patent No.: US 11,157,028 B1
(45) Date of Patent: Oct. 26, 2021

(54) FAST PRECISION DROOP DETECTOR

(71) Applicant: CENTAUR TECHNOLOGY, INC., Austin, TX (US)

(72) Inventor: James R. Lundberg, Austin, TX (US)

(73) Assignee: CENTAUR TECHNOLOGY, INC., Austin, TX (US)

( * ) Notice: Subject to any disclaimer, the term of this patent is extended or adjusted under 35 U.S.C. 154(b) by 0 days.

(21) Appl. No.: 17/099,821

(22) Filed: Nov. 17, 2020

(51) Int. Cl.
| | |
|---|---|
| G05F 1/10 | (2006.01) |
| G05F 1/575 | (2006.01) |
| G05F 1/625 | (2006.01) |
| G01R 17/02 | (2006.01) |
| G01R 19/00 | (2006.01) |
| H03L 7/081 | (2006.01) |

(52) U.S. Cl.
CPC .............. *G05F 1/575* (2013.01); *G01R 17/02* (2013.01); *G01R 19/0084* (2013.01); *G05F 1/625* (2013.01); *H03L 7/0818* (2013.01)

(58) Field of Classification Search
CPC ...... G05F 1/575; G05F 1/625; G01R 19/0084; G01R 17/02; H03L 7/0818
USPC ........................................................ 327/540
See application file for complete search history.

(56) References Cited

U.S. PATENT DOCUMENTS

| | | | | |
|---|---|---|---|---|
| 6,333,670 B1 * | 12/2001 | Kono | ............. | G05F 1/465 327/541 |
| 6,914,476 B2 * | 7/2005 | Ingino, Jr. | ............. | G05F 1/575 327/143 |
| 7,714,635 B2 * | 5/2010 | Singh | ............. | H03K 19/00384 327/535 |
| 7,880,554 B2 * | 2/2011 | Raghunathan | ......... | H03K 3/013 331/186 |
| 8,710,913 B2 * | 4/2014 | Baumann | ......... | H03K 19/00384 327/540 |
| 8,994,447 B2 * | 3/2015 | Xie | ............. | G06F 1/305 327/540 |
| 2005/0162141 A1 * | 7/2005 | Kanakubo | ............. | G05F 1/575 323/274 |
| 2012/0153910 A1 * | 6/2012 | Bulzacchelli | ............. | G05F 1/575 323/272 |
| 2013/0069607 A1 * | 3/2013 | Suzuki | ............. | G05F 1/575 323/271 |

FOREIGN PATENT DOCUMENTS

WO    WO-2020053879 A1 *  3/2020  ............. G05F 1/565

* cited by examiner

*Primary Examiner* — Ryan Jager
(74) *Attorney, Agent, or Firm* — McClure, Qualey & Rodack, LLP

(57) ABSTRACT

In one embodiment, a droop detector circuit, comprising: a reference oscillator; plural delay lines configured to receive signals from the reference oscillator; and logic configured to detect droop in a voltage regulator based on an output of the voltage regulator and outputs of each of the plural delay lines.

20 Claims, 7 Drawing Sheets

FAST PRECISION DROOP DETECTOR

TECHNICAL FIELD

The present invention relates in general to droop detection, and in particular, droop detection in microprocessors.

BACKGROUND

Voltage regulators, and particularly, voltage regulator modules (VRMs), are used to provide microprocessors with an appropriate supply voltage. Typically, VRMs are mounted to a motherboard via a solder connection or a slot designed to accept the VRM. Some VRMs provide a fixed supply voltage to the microprocessor, whereas others sense the required supply voltage from the microprocessor, enabling a variable adjustment.

Microprocessors may demand fast changes in load current (e.g., when switching out of an idle or power saving state), which imposes challenges for the VRM. For instance, the VRM may experience a large step-change in load current within a period measured in nanoseconds. Voltage droop compensation is one technique used for these types of conditions, which intentionally increases the DC output impedance of a converter, lowering its output as load current increases. In effect, voltage droop compensation reduces overshoot of the supplied voltage during large step changes in load current. Choosing the amount of voltage droop to apply is challenging, since it often involves knowledge of the worst-case transient load changes, which are hard to predict. Voltage droop compensation needs to maintain close fidelity to the desired supply voltage while accommodating transient loads without experiencing an unacceptable degree of voltage droop that can be detrimental to performance (e.g., inadequate power, and hence reduced clock speeds).

SUMMARY

In one embodiment, a droop detector circuit, comprising: a reference oscillator; plural delay lines configured to receive signals from the reference oscillator; and logic configured to detect droop in a voltage regulator based on an output of the voltage regulator and outputs of each of the plural delay lines.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Various aspects of the invention can be better understood with reference to the following drawings. The components in the drawings are not necessarily to scale, with emphasis instead being placed upon clearly illustrating the principles of the present invention. Moreover, in the drawings, like reference numerals designate corresponding parts throughout the several views.

DETAILED DESCRIPTION

Figure 1:
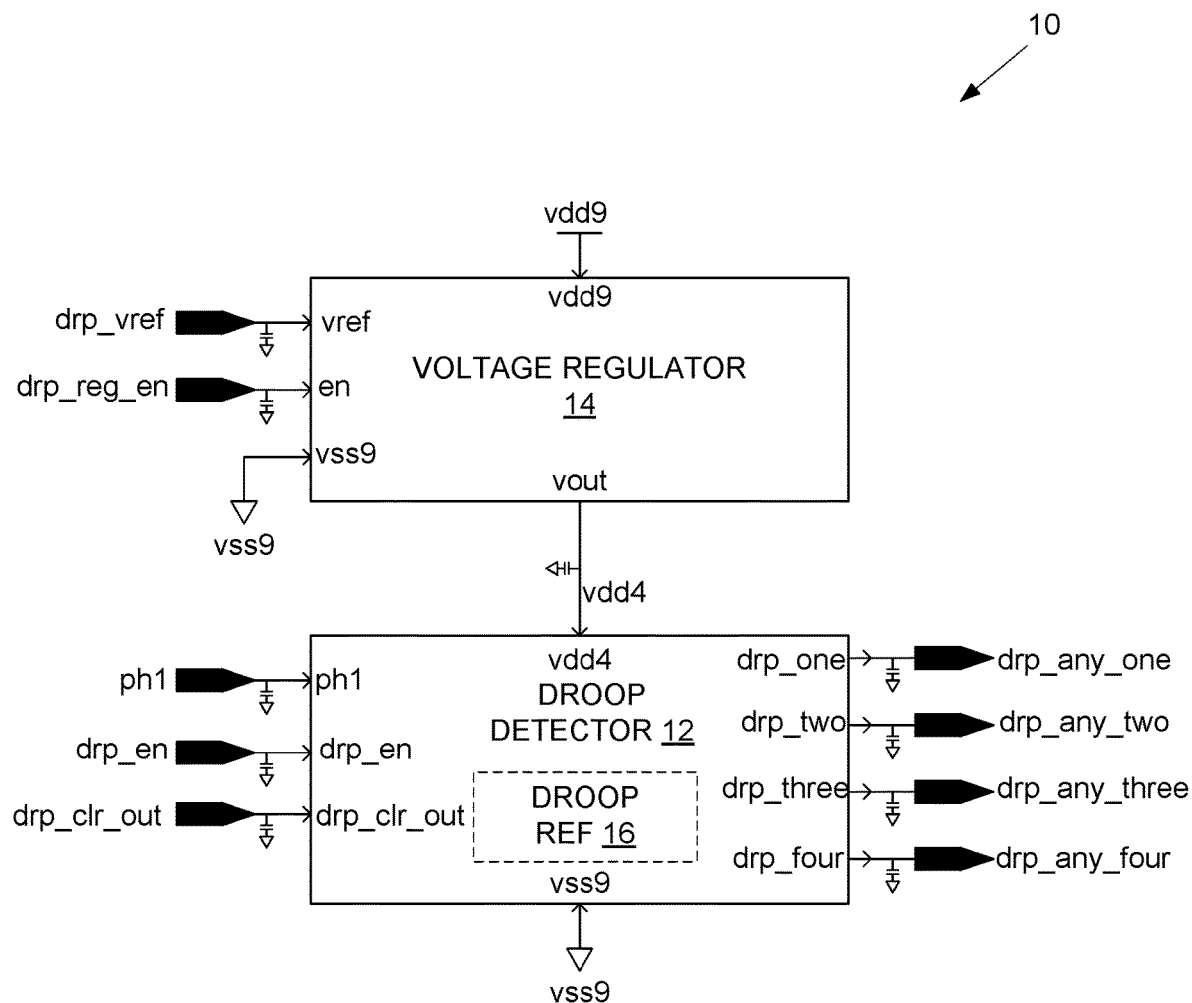
FIG. 1 is a block diagram showing an embodiment of an example droop detection system comprising a droop detector coupled to a voltage regulator.

Certain embodiments of a droop detection system and method are disclosed that detects droop in a microprocessor and uses the detection to adjust clock speeds in an effort to improve microprocessor performance. In one embodiment, the droop detection system comprises a droop detector having a reference oscillator, plural delay lines, and detection logic that is configured to detect the droop in a voltage regulator based on the outputs of the voltage regulator and the delay lines. In some embodiments, a droop reference is used in conjunction with a droop detector to reject high frequency noise and track supply voltage ramp ups and ramp downs, providing a filtered and scaled version of the microprocessor voltage supply.

Digressing briefly, power consumed by a microprocessor may be affected by one or more of a variety of factors, including instruction types, dispatch rates of instructions, data being operated on, etc. Rapid changes in current drawn by the microprocessor, which may result in voltage instability, may be triggered by sudden changes in any of these factors. A rapid change in current drawn by a circuit on a chip, for instance, may cause a temporary droop (or spike) in a supply voltage received from a voltage regulator, whereas a decrease in current may be reflected as a spike in supply voltage. Further, the switching speed of a transistor used in the microprocessor is a function of voltage applied to its gate. For instance, transistor switching speeds typically decrease at lower voltages Accordingly, a droop in regulator supply voltage may slow down logic elements between latches, which may give rise to failures if these latches and the clocks feeding them are not local to an event and run at full speed. Also, the voltage droop may get coupled back to the input of the voltage regulator, which may cause other circuits on the chip to fail. Certain embodiments of a droop detection system adapt to these droop events by adjusting clocks speeds until the droop has subsided, preventing or mitigating faulty operation of the microprocessor and/or devices located within the microprocessor.

Having summarized certain features of a droop detection system of the present disclosure, reference will now be made in detail to the description of a droop detection system as illustrated in the drawings. While a droop detection system will be described in connection with these drawings, there is no intent to limit it to the embodiment or embodiments disclosed herein. That is, while the invention is susceptible to various modifications and alternative forms, specific embodiments thereof are shown by way of example in the drawings and will herein be described in detail sufficient for an understanding of persons skilled in the art. It should be understood, however, that the drawings and detailed description thereto are not intended to limit the invention to the particular form disclosed. On the contrary, the intention is to cover all modifications, equivalents and alternatives falling within the spirit and scope of the present invention as defined by the appended claims. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, modules, circuits, logic, or other components may be described as "configured to" perform a task or tasks. In such contexts, "configured to" is a broad recitation of structure generally meaning "having circuitry or another physical structure that" performs, or is capable of performing, the task or tasks during operations. The circuitry may be dedicated circuitry, or more general processing circuitry operating under the control of coded instructions. That is, terms like "unit", "module", "circuit", "logic", and "component" may be used herein, in describing certain aspects or features of various implementations of the invention. It will be understood by persons skilled in the art that the corresponding features are implemented utilizing circuitry, whether it be dedicated circuitry or more general purpose circuitry operating under micro-coded instruction control.

Further, the unit/module/circuit/logic/component can be configured to perform the task even when the unit/module/circuit/logic/component is not currently in operation. Reciting a unit/module/circuit/logic/component that is configured to perform one or more tasks is expressly intended not to invoke 35 U.S.C. § 112(f) for that unit/module/circuit/logic/component. In this regard, persons skilled in the art will appreciate that the specific structure or interconnections of the circuit elements will typically be determined by a compiler of a design automation tool, such as a register transfer language (RTL) compiler. RTL compilers operate upon scripts that closely resemble assembly language code, to compile the script into a form that is used for the layout or fabrication of the ultimate circuitry.

That is, integrated circuits (such as those of the present invention) are designed using higher-level software tools to model the desired functional operation of a circuit. As is well known, "Electronic Design Automation" (or EDA) is a category of software tools for designing electronic systems, such as integrated circuits. EDA tools are also used for programming design functionality into field-programmable gate arrays (FPGAs). Hardware descriptor languages (HDLs), like Verilog and very high-speed integrated circuit hardware descriptor language (VHDL) are used to create high-level representations of a circuit, from which lower-level representations and ultimately actual wiring can be derived. Indeed, since a modern semiconductor chip can have billions of components, EDA tools are recognized as essential for their design. In practice, a circuit designer specifies operational functions using a programming language like C/C++. An EDA software tool converts that specified functionality into RTL. Then, a hardware descriptor language (e.g. Verilog) converts the RTL into a discrete netlist of gates. This netlist defines the actual circuit that is produced by, for example, a foundry. Indeed, these tools are well known and understood for their role and use in the facilitation of the design process of electronic and digital systems, and therefore need not be described herein.

Attention is now directed to FIG. 1, which shows an embodiment of an example droop detection system 10 comprising a droop detector 12 coupled to a voltage regulator 14. The voltage regulator 14 comprises analog logic. The droop detector 12 comprises digital logic. Beginning from the top of the diagram, vdd9 represents a power supply voltage. For instance, a typical power supply voltage is 1.8 volts (V). Vss9 is an analog (quiet) ground. Vdd9 and vss9 are received onto a microprocessor. The output of the voltage regulator 14 is vdd4. Vdd4 varies according to the analog voltage droop reference, or drp_vref, received at the pin labeled, vref. Drp_vref is a voltage reference. The enable pin, labeled en in FIG. 1, receives an enable signal drp_reg_en. If no signal is received at the enable pin, that means that there is no output from the voltage regulator 14. For instance, there may be circumstances where droop is of no concern, such as where the microprocessor is running at slow clock speeds but at a sufficiently high voltage where a wide range of droop voltages can be tolerated. By not enabling the output of the voltage regulator 14, power may be saved.

Vdd4 is provided to the droop detector 12. As explained above, vss9 is analog ground. The two supplies vdd4 and vss9 are used for a ring oscillator disposed within the droop detector 12, as explained further below. Pin ph1 receives a clock ph1 that is generated by the microprocessor, and is used to provide proper synchronization to the clock domain. The other two input pins, drp_en and drp_clr_out (clear), are enable pins that receive drp_en and drp_clr_out, respectively, which are known digital functions. The droop detector 12 includes output pin, drp_one, drp_two, drp_three, and drp_four for providing an indication that droop has been detected over one or more delay line periods, as explained further below.

In some embodiments, the droop detector 12 further comprises a droop reference 16, which is explained below in association with FIGS. 3A-3C.

Figure 2A:
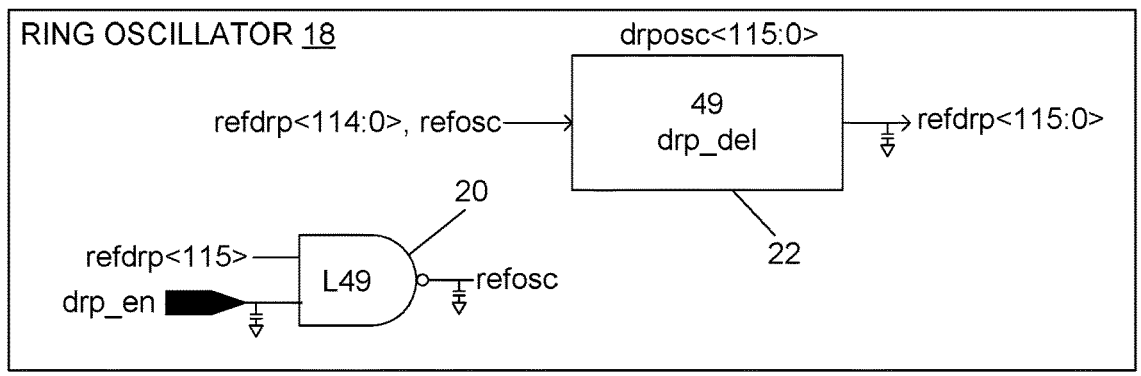
FIG. 2A is a schematic diagram showing an embodiment of an example ring oscillator used in a droop detector.

Referring now to FIG. 2A, shown is a schematic representation of an embodiment of an example ring oscillator 18 used in the droop detector 12. The ring oscillator 18 comprises an enable device 20 and a series of delay inverters collectively represented by a delay block 22. The enable device 20 comprises a NAND gate, which functions as an enable of the delay block 22. The enable device 20 is labeled with a 4 and a 9 representing the power supply for that block (e.g., vdd4 and vss9 as explained in association with FIG. 1). An output of the enable device 20 is the reference oscillator signal (refosc), and the inputs include the droop enable (drp_en), which is described in association with FIG. 1, and the last delay inverter output (refdrp<115>) of the delay block. The delay block 22 has a label located above it, namely, droop oscillator or drposc<115:0>, which is used to signify that the delay block 22 is actually 116 of such blocks (inverters or delay stages) arranged in series. Notably, the output of the delay block 22 is reference droop, or refdrp<115:0>. For instance, the output of a first stage or block of the delay block is ref droop 0 (refdrp_0), the output of a second stage or block is ref droop 1(refdrp_1), followed similarly by ref droops 2, 3, 4 . . . 115.

The inputs to the delay block 22 include the output (refosc) of the enable device 20 initially, followed by the respective output signals for each block of the delay block 22 feeding the next block of the delay block 22 (e.g., shown illustratively as feeding back to the input (refdrp<114:0>).

For instance, the first input to a first block of the delay block 22 is refosc. The second block in series with the first block of the delay block 20 receives an output, refdrp<0>. A third block in series with the second block of the delay block 20 receives an output, refdrp<1>, and so on until the last block of the delay block 22 outputs refdrp<115>, which is fed back to the enable device 20, and the process continues. To represent this process, the delay block 22 merely shows the inputs as, initially, refosc, followed by the outputs at each stage or block of the delay block refdrp<114:0> (e.g., refdrp<0>, refdrp<1>, refdrp<2>, . . . refdrp<115>). Stated otherwise, FIG. 2A is a shorthand way of representing the 116 blocks of the delay block 22 arranged in series and its interaction with the enable device 20. The ring oscillator 18 thus provides for a continual oscillation signal, and by doing so, avoids startup current surge (e.g., no di/dt induced inaccuracies since it runs constantly).

In effect, the ring oscillator 18 is powered off of the voltage regulator 14, where operation is based on vdd4 and vss9 (vdd4−vss9). The period of the ring oscillator 18 is proportional to the supplied voltage.

Figure 2B:
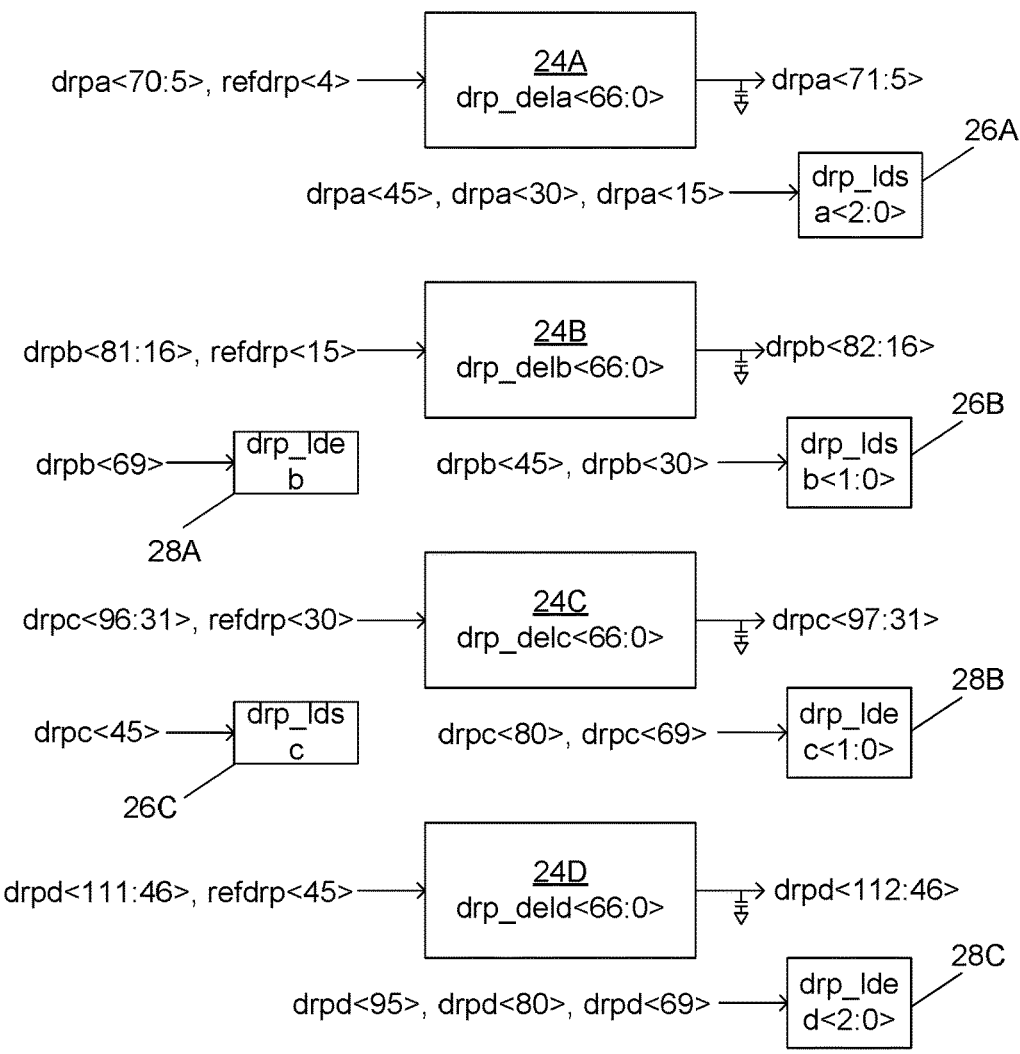
FIG. 2B is a schematic diagram showing an embodiment of example delay lines used in a droop detector.

Referring now to FIG. 2B, shown is an embodiment of example delay lines used in a droop detector 12. In one embodiment, there are four (4) delay line blocks (drp_dela-drp_deld), or 24A, 24B, 24C, and 24D, though in some embodiments, fewer or additional delay line blocks may be used. In one embodiment, each delay line block 24 (e.g., 24A, 24B, 24C, and 24D) comprises 67 (e.g., denoted <66:0>) delay blocks or inverters arranged in series. In some embodiments, the quantity of blocks or stages per delay line block 24 may be different than that used, and hence contemplated to be within the scope of the disclosure. The first stage or block of each delay line block 24 runs off of an output (refdrp) of the reference oscillator 18, and these outputs are used as an initial input to each of the delay line blocks 24 followed by the chain of delay lines in each block 24, in a staggered manner. For instance, one of the inputs to the delay line block 24A (i.e., the first stage of the delay line block 24A) is refdrp<4>. One of the inputs to the delay line block 24B (i.e., the first stage of the delay line block 24B) is refdrp<15>. One of the inputs to the delay line block 24C (i.e., the first stage of the delay line block 24C) is refdrp<30>. One of the inputs to the delay line block 24D (i.e., the first stage of the delay line block 24D) is refdrp<45>. Note that other stages used as input to the respective delay line blocks 24 to enabling a staggered start may be used in some embodiments. Notably, the delay line blocks 24 are shown in FIG. 2B in similar fashion to the representation used in FIG. 2A for the reference oscillator 18. For instance, the output of the delay line block 24A is drpa<71:5>, which represents the respective outputs of the 67 stages that begins after refdrp<4>. Similarly, the outputs of delay line blocks 24B, 24C, and 24D are drpb<82:16>, drpc<97:31>, and drpd<112:46>, respectively.

Explaining further, and taking delay line block 24a as a representative example for inputs and outputs of each of the delay line blocks 24, the delay line blocks 24A comprises a first stage or block that receives an initial input (refdrp<4>) from the reference oscillator 18. The second stage or block of the delay line block 24a receives an output, drpa<5>, from the first stage or block. The third stage or block of the delay line block 24A receives an output, drpa<6>, from the second stage or block, and so on. In the diagram, this chain of inputs/outputs from one stage to the next among the blocks of the delay line block 24A is schematically represented as a feedback from the output of the delay line block 24A to the input of the delay line block 24A. A similar description, using different staggered start values, values applies to the other delay line blocks 24B 24C, and 24D, and are hence omitted here for brevity.

Figure 2C:
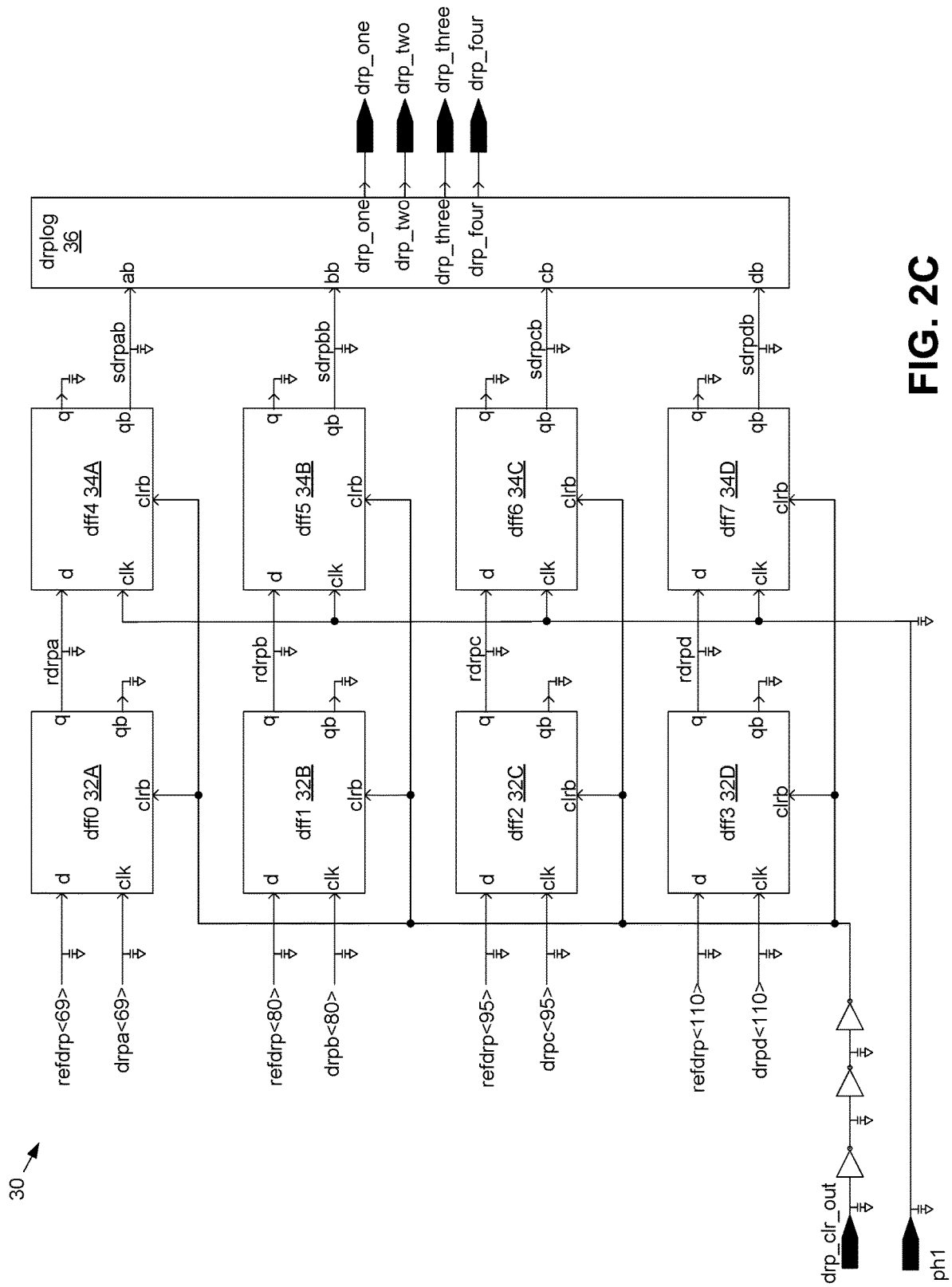
FIG. 2C is a schematic diagram showing an embodiment of example droop detect logic used in a droop detector.

Associated with each of the delay lines 24 is additional circuitry used to match the ring oscillator 18 to the delay lines blocks 24 in all stages and to flip flops that receive staggered outputs from each of the delay line blocks, as shown in FIG. 2C and described below. For instance, when the ring oscillator 18 sends an output to start a given delay line 24 (e.g., depending on the transition, one or more of refdrp<15>, refdrp<30>, and refdrp<45>), a matching load has to occur at the delay line 24 in play. These matching loads are referred to as start loads or lds, and are denoted in FIG. 2B as ldsa 26A (e.g., three of them or <2:0>, corresponding to stage line communications drpa<15>, drpa<30>, and drpa<45>), ldsb 26B (two of them, <1:0>, corresponding to stage line communications drpb<30> and drpb<45>), and ldsc 26C (one of them, or lds_c, corresponding to stage line communication drpc<45>).

Additionally, the ring oscillator 18 communicates a signal to the flip flops corresponding to each delay line block 24, and as described above, signal these flip flops at stages refdrp<69>, refdrp<80>, refdrp<95>, and refdrp<110>. These matching loads are referred to as end loads or lde, and are denoted in FIG. 2B as ldeb 28A (e.g., one of them or ldeb, corresponding to stage line communication (to the flip flop) drpb<69>), ldec 28B (two of them, <1:0>, corresponding to stage line communications drpc<69> and drpc<80>), and lded 28C (three of them, <2:0>, corresponding to stage line communication drpd<69>, drpd<80>, and drpd<95>). Note that the values of when the ring oscillator 18 provides these signals may be different in some embodiments, and that the values used here are for illustration of one example operation.

Further, it should be appreciated by one having ordinary skill in the art that there may be additional circuitry in FIG. 2B to account for parasitics, capacitances, resistances. In other words, appropriate circuitry, not shown but understood by one having ordinary skill in the art, may be used to maintain symmetry.

Attention is now directed to FIG. 2C, which shows an embodiment of example droop detect logic 30 used in a droop detector. The droop detect logic 30 comprises four (4) branches corresponding to the outputs of the four delay line blocks 24 (FIG. 2B), each branch comprising a pair of flip flops 32, 34 for each of the delay lines 24. The droop detect logic 30 further comprises combinational logic 36 (drplog) that receives the outputs from the respective flip flops 34 to determine the presence of droop and whether the droop is sustained or not (over more than one period of delay lines). In one embodiment, the flip flops 32, 34 comprise D-type flips flops (e.g., D-flip flops, differential D-flip flops). Referring to the top pair of flip flops, dff0 32A and dff4 34A depicted in FIG. 2C, dff0 32A receives a particular stage ring oscillator output (e.g., refdrp<69>) at the d input and a corresponding stage output from the delay line 24A (e.g., drpa<69>) at the clk input. Dff0 32A also receives a clock drp_clr_out (shown also in FIG. 1) at the clrb clock input. Dff0 32A outputs (from q output) an intermediate output, rdrpa to the d input of dff4 34A. Dff4 34A also receives a clock input (ph1) at clk input and the clock input drp_clr_out at the clrb input. Dff4 34A outputs at output qb sdrpab to an ab input of the combinational logic (drplog) 36.

Explaining the operation of the droop detect logic 30 using the top branch comprising dff0 32A and dff4 34A as a representative example, in effect, dff0 32A is receiving the oscillator reference (refdrp<69>) and the output droop (drpa<69>) from the delay line 24A, both from the same stage <69>. If the droop (drpa<69>) is slower than the reference (refdrp<69>), the dff0 32A captures the value. In fact, a slower droop reveals the presence of droop (hence detected). The reference droop (refdrp<69>) should be slower, since it runs at a lower voltage. Stated otherwise, the droop (drpa<69>) should be faster since it runs at a higher (e.g., full) supply voltage. As an illustrative example, if the microprocessor is running at 1 volt, and if there is a desire to determine if there is a 10% drop in the power supply (e.g., vref to the voltage regulator 14 is 90% of vdd0 or 900 millivolts (mV)), the ring oscillator 18 is run at 900 mV. If the microprocessor drooped more than 900 mV, the dff0 32A detects this condition by virtue of the input to the d and clk inputs of dff0 32A.

As to dff4 34A, as noted above, dff4 34A uses ph1 for its clock (to clrb), which is to synch the outputs of dff0 32A into the ph1 time domain (e.g., the global time domain of the microprocessor).

The next pair of flip flops (next branch comprising dff1 32B and dff5 34B) of the droop detect logic 30, dff1 32B receives a certain stage output of the ring oscillator (refdrp<80>) at the d input to dff1 32A, and the corresponding stage output (drpb<80>) at the clk input from the delay line 24B. The clock input is drp_clr_out at clrb, and the output is rdrpb from the q output. In other words, dff1 32B and dff5 34B are identical in input/output arrangement as dff0 32A and dff4 34A, except that dff1 32B starts at a different bit (e.g., <80>). In other words, dff1 32B is delayed in its stage relative to dff0 32A, but each makes use of the same number of delay line stages (e.g., 67 stages) from the delay line blocks 24 of FIG. 2B.

Recall that the delay lines 24 had staggered starts (e.g., <4>, <15>, <30>, and <45>), and hence the flip flops 32 have staggered starts. The four matched delay lines 24A-24D with staggered starts enables at least one droop evaluation by the droop detect logic 30 per high speed clock period, which allows for long delay lines. Longer delay lines 24 reduces the variability observed in silicon (e.g., by 8×). For instance, variabilities from one inverter to another may be large, but with many in series, the variability averages out (e.g., from 2 to 64, for instance, variability is approximately ⅛th of the delay line period). Further, a longer delay line is slower than a clock period for the microprocessor (e.g., when run at full speed), and hence with staggered starts among the delay lines, at least one evaluation may be performed during one clock period (ph1).

The other pairs of flips flops for the other branches, dff2 32C, dff6 34C, and dff3 32D, dff7 34D, are identical to the above arrangement of flip flop pairs, with staggered starts (e.g., refdrp<95>, drpc<95> for dff2 32C, and refdrp<110>, drpd<110> for dff3 32D), and hence the description above may be extended similarly for these pairs.

The combinational logic (drplog) 36 shows four possible outputs, namely, drp_one, drp_two, drp_three, and drp_four. In some embodiments, fewer or more outputs may be used and hence are contemplated to be within the scope of the disclosure. Drplog 36 receives the indication of whether droop has been detected based on inputs from the flips flops 34 (e.g., at inputs ab, bb, cb, and db). When droop is detected over more than one delay line period, such an event reveals a prolonged droop event that is output by Drplog 36 (e.g., extending over two lengths, or drp_two, extending over three lengths or drp_three, etc.). A droop event should sustain or exceed a droop relative to the reference for the entire length of the delay line 24. Note that there may be multiple, sustained (subsequent) periods of droop. The deassertation of any or all of the droop events enables the microprocessor to resume high frequency operation.

Figure 2D:
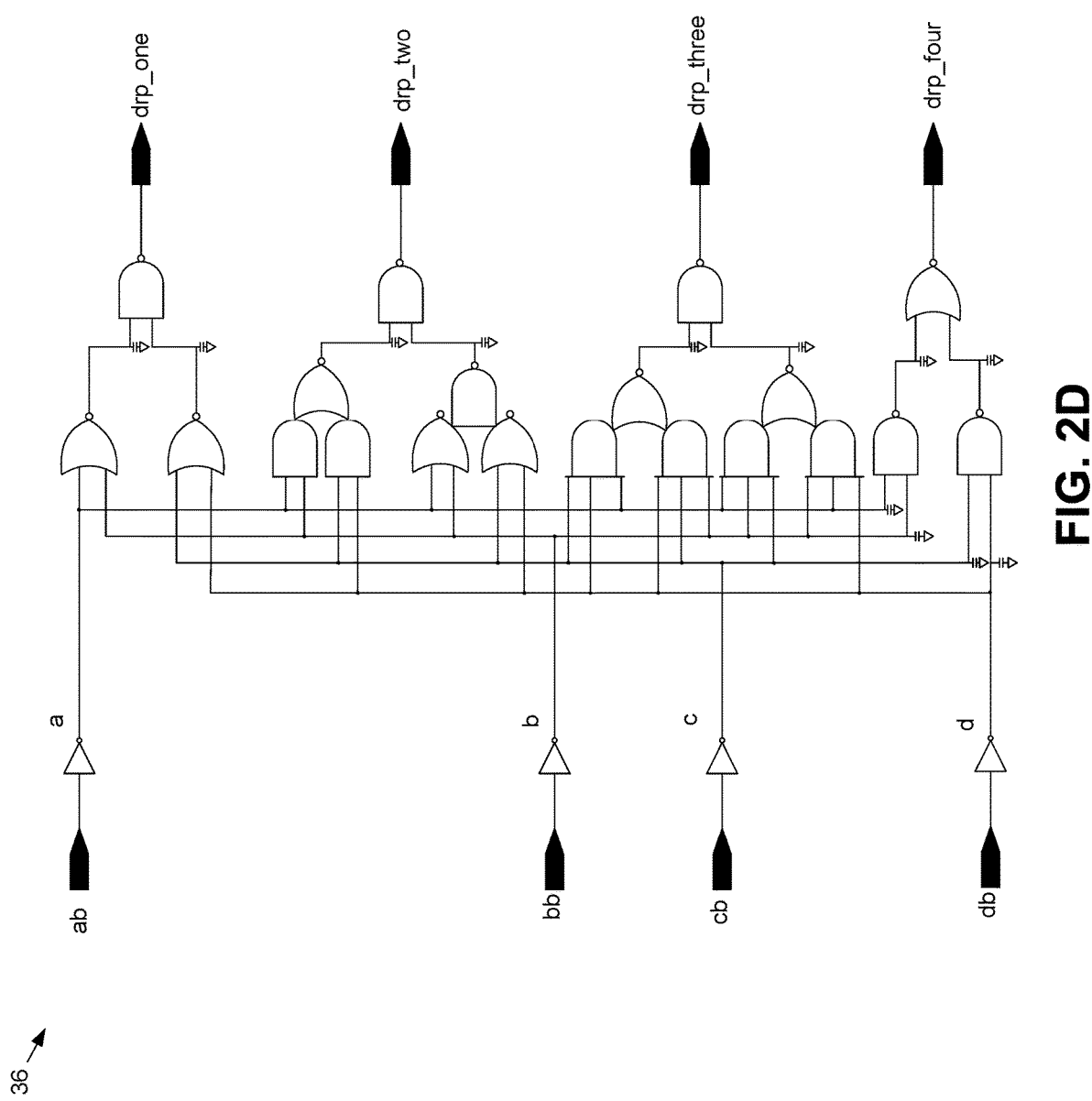
FIG. 2D is a schematic diagram showing example combinational logic used in a droop detector.

The microprocessor may implement one of a plurality of different remedial measures when droop is sustained for too long (e.g., when all four drp_one, drp_two, drp_three, and drp_four are triggered). One remedial measure is for the microprocessor to slow the clock down (e.g., until the droop event subsides). In some embodiments, the microprocessor may cause a switch to another phase-locked loop (PLL) with a slower clock period (e.g., as signaled out of the droop detect logic 30). Note that a trigger for remedial measures may involve one, two, three, or four delay line droops. The evaluation over multiple delay lines 24 also minimizes variation. One example embodiment of the combinational logic 36 is shown in FIG. 2D, which operation is conventional and hence discussion of the same is omitted here for brevity.

It is noted that certain embodiments of a droop detector 12 is configured to detect a rise in vss or a droop on vdd (e.g., the droop detector 12 measures vdd−vss), either one of which may cause a slow-down of the delay lines. In contrast, conventional droop detectors assume vss is static and does not move, and hence rely on a measure of vdd only.

Another benefit to certain embodiments of a droop detector 12 is that there is no start-up current surge associated with the droop detector 12, as the ring oscillator 18 runs continuously (e.g., runs asynchronously to the chip). This is in contrast to other droop detectors that use a reference voltage delay line off of a trigger gate, and hence run synchronously to the chip.

Additionally, certain embodiments of a droop detector 12 are programmable to trigger on either a constant voltage level (e.g., vdd−vss) or a percentage of vdd−vss. This feature may enable use of different instantiations of the droop detector in different areas of the microprocessor, or may permit operation with voltage regulator modules (VRMs), which provide for dynamic voltage supplies based on voltage identification definition (VID), which comprise a set of bits. For instance, once the VRM receives the VID identifying the required supply voltage, the VRM functions as a voltage regulator. The voltage regulator may provide the required constant voltage supply to the microprocessor. In some applications, VID lines may be used by the microprocessor to instruct an on-board power converter (e.g., a switch-mode, buck converter) of the desired voltage level, which in turn adjusts its output accordingly.

In some embodiments of a droop detector, the need to track the ramp of the voltage supply while rejecting instantaneous noise is particularly valuable since there is no need to regenerate another reference supply voltage. Further, having the ability to choose to have a constant voltage (e.g., not change with ramp of the power supply) is also valuable, as it provides for flexibility in design. FIG. 3A shows an embodiment of an example droop reference 38 of, or coupled to, a droop detector (e.g., droop detector 12) and that comprises a programmable filter and digital-to-analog converter. Note that droop reference 38 may be implemented as droop reference 16 shown in FIG. 1. In general, the droop reference 38 provides a single reference for plural droop detectors (e.g., its location is independent of the location of other detectors). In one embodiment, the droop reference 38 comprises a serial arrangement of a programmable, low-pass filter (LPF) 40, a buffer 42, a digital-to-analog converter (DAC) 44, followed by another buffer 46. The programmable LPF 40 receives the supply voltage for the microprocessor (vdd_cpu) and a control signal, lpfbw (low pass filter bandwidth). In one embodiment, the control signal comprises a 4 bit digital field that may be controlled by any one of a number of different sources, including a scan, fuses, microcode, digital logic, etc. The control signal lpfbw controls what frequency the programmable LPF 40 passes (or rejects). The programmable LPF 40 is configured to remove high frequency content from vdd_cpu.

Figure 3A:
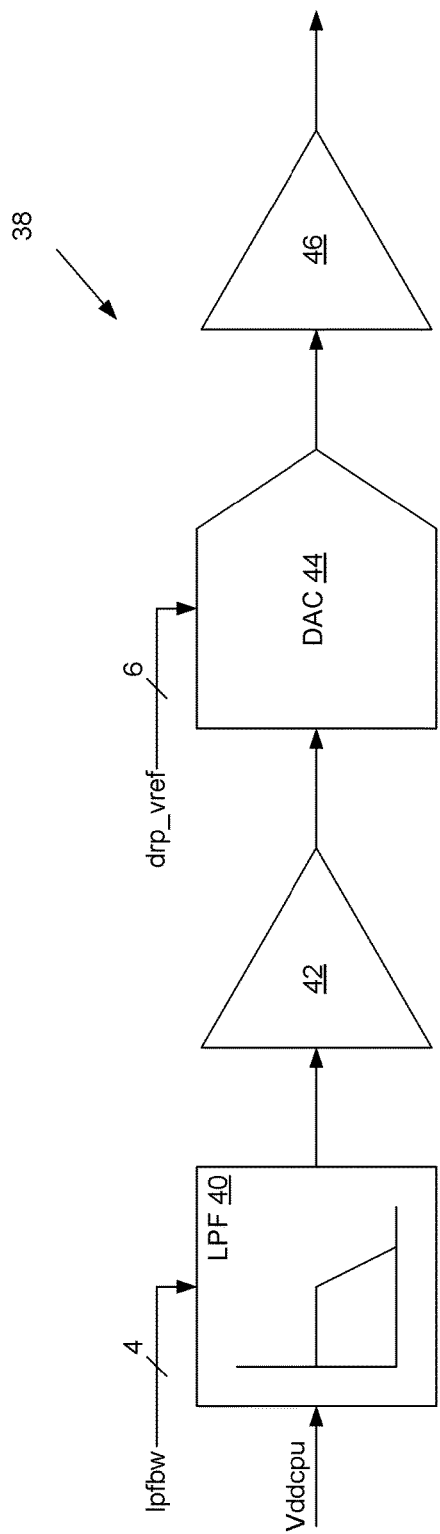
FIG. 3A is a schematic diagram showing an embodiment of an example droop reference of, or coupled to, a droop detector, and comprising a programmable filter and digital-to-analog converter.
Figure 3B:
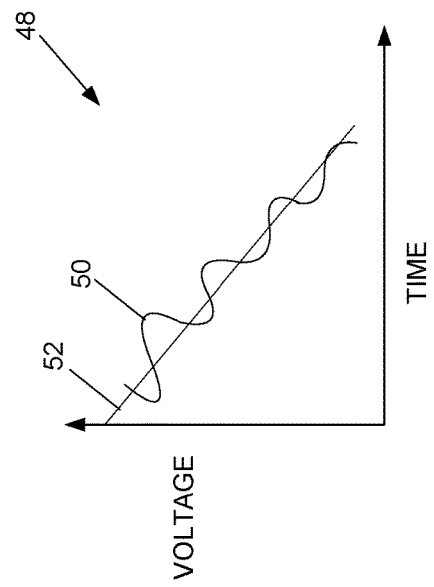
FIG. 3B is a plot schematic showing how an embodiment of a droop reference is intended to track both unwanted high frequency noise and changes in voltage supply.

With continued reference to FIG. 3A, and referring also to FIG. 3B, shown is a plot diagram 48 that schematically illustrates an example low-pass filter input 50 (e.g., measured in voltage, Y-axis) versus the low-pass filter output 52 (e.g., measured in time, X-axis) of the programmable LPF 40. As shown in FIG. 3B, not only can the vdd_cpu have unwanted, high frequency noise, but vdd_cpu may change dynamically. During these changes, vdd_cpu ramps up, or as revealed in this example, ramps down. The programmable LPF 40 tracks the ramp of vdd_cpu and rejects the high frequency noise. The programmability of the LPF 40 (e.g., via the control signal, lpfbw) allows the corner frequency to be adjusted.

Directing attention again to FIG. 3A, buffers 42 and 46 provide a typical role of transferring a voltage from a high impedance device to a low impedance device with relatively insignificant current draw. The buffer 46 is used to drive the scaled and filtered vdd_cpu to the rest of the circuitry of the droop detector 12. Since the details of buffers comprise known technology, further discussion of the same is omitted for brevity.

The DAC 44 is configured to provide a scaling of the filtered vdd_cpu. The DAC 44 receives the output from the programmable LPF 40 (via intervening buffer 42) and also receives a control signal (drp_vref, as mentioned in association with FIG. 1). Drp-vref, through the voltage regulator 14, equals (from FIG. 1) vdd4. In other words, drp_vref is equal in voltage magnitude to vdd4, where vdd4 is generated as the output of the voltage regulator 14 (e.g., running off vdd9, for instance, 1.8 v). In one embodiment, drp_vref is a 6 bit field that may be controlled by any one of a number of different sources, including a scan, fuses, microcode, digital logic, etc.

Figure 3C:
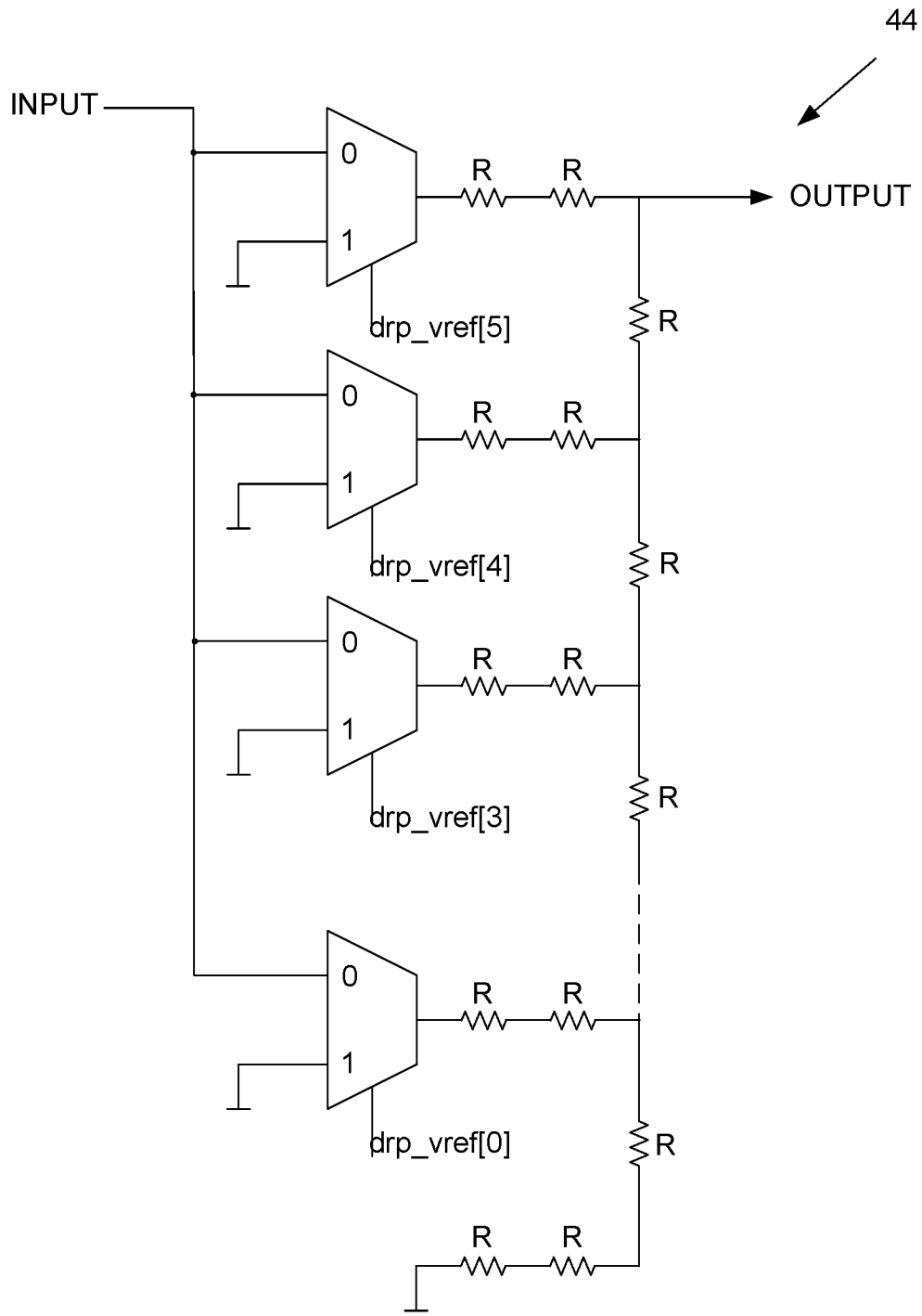
FIG. 3C is a schematic diagram showing an embodiment of an example circuit for the digital-to-analog converter of a droop reference.

FIG. 3C is a schematic diagram showing an embodiment of the DAC 44. In one embodiment, the DAC 44 is implemented as a resistor ladder having an R2R ladder configuration, as is known in the industry. As shown in FIG. 3C, each branch is controlled by digital input bits that switch between the filtered vdd_cpu (the input) and analog ground (e.g., vss9 from FIG. 1). Each logic gate (for each branch) receives a given bit configuration of the control signal, drp_vref (e.g., drp_vref[0], . . . drp_vref[5], where the resistive network causes these bits to be weighted in their contribution to the output. The output comprises a filtered, scaled version of vdd_cpu, which may be represented by the following generalized Equation 1:

Filtered,scaled vdd_cpu=[(drp_vref[5:0])/(2^6)]×filtered vdd_cpu.

Note that the droop reference 38 is described above as circuitry of the droop detector 12, but in some embodiments, may comprise intervening circuitry between the droop detector 12 and the voltage regulator 14.

Figure 4:
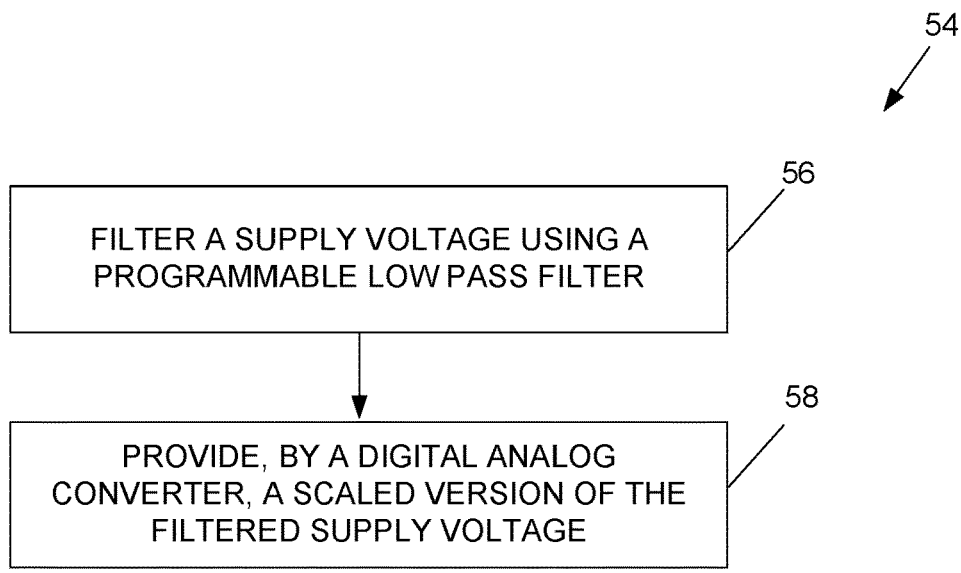
FIG. 4 is a flow diagram that shows an embodiment of an example method performed by an embodiment of a droop reference.

Having described certain embodiments of a droop detection system, it should be appreciated that one embodiment of an example method performed by an embodiment of a droop reference, the method denoted as method 54 in FIG. 4, comprises filtering a supply voltage using a programmable low pass filter (56); and providing, by a digital-to-analog converter, a scaled version of the filtered supply voltage (58).

Figure 5:
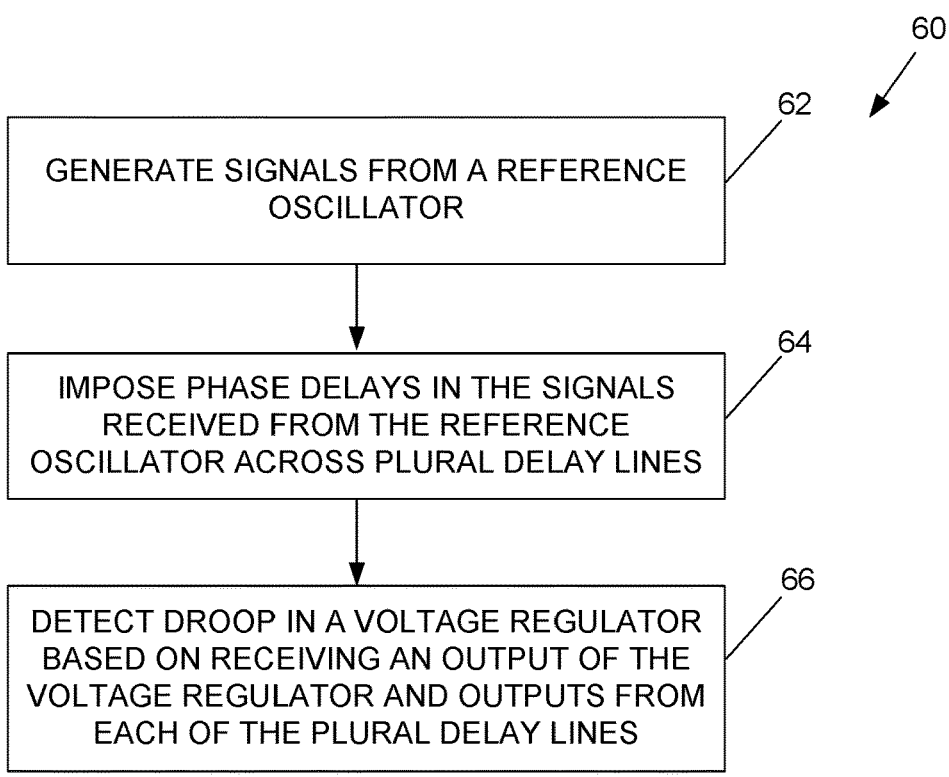
FIG. 5 is a flow diagram that shows an embodiment of an example method performed by an embodiment of a droop detector.

Additionally, it should be appreciated that one embodiment of an example method performed by an embodiment of a droop detector, the method denoted as method 60 in FIG. 5, comprises: generating signals from a reference oscillator (62); imposing phase delays in the signals received from the reference oscillator across plural delay lines (64); and detecting droop in a voltage regulator based on receiving an output of the voltage regulator and outputs from each of the plural delay lines (66).

Any process descriptions or blocks in flow diagrams should be understood as representing modules, segments, logic, or portions of code which include one or more executable instructions for implementing specific logical functions or steps in the process, and alternate implementations are included within the scope of the embodiments in which functions may be executed out of order from that shown or discussed, including substantially concurrently or in different order, depending on the functionality involved, as would be understood by those reasonably skilled in the art of the present disclosure.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

Note that various combinations of the disclosed embodiments may be used, and hence reference to an embodiment or one embodiment is not meant to exclude features from that embodiment from use with features from other embodiments. In the claims, the word "comprising" does not exclude other elements or steps, and the indefinite article "a" or "an" does not exclude a plurality.

The invention claimed is:

1. A droop detector circuit, comprising:
a reference oscillator;
plural delay lines configured to receive signals from the reference oscillator; and
logic configured to detect droop in a voltage regulator based on an output of the voltage regulator and outputs of each of the plural delay lines.

2. The droop detector circuit of claim 1, wherein each of the plural delay lines have staggered starts from the signals of the reference oscillator.

3. The droop detector circuit of claim 2, wherein the logic is configured to evaluate droop per respective clock period for each of the respective plural delay lines.

4. The droop detector circuit of claim 3, wherein the logic is further configured to evaluate two or more of the plural delay lines to enable detection of sustained droop over the corresponding plural clock periods.

5. The droop detector circuit of claim 1, wherein the logic is further configured to evaluate a difference between the output (vdd) of the voltage regulator and ground (vss).

6. The droop detector circuit of claim 1, wherein the reference oscillator runs continuously for plural cycles associated with the delay lines.

7. The droop detector circuit of claim 1, wherein the plural delay lines and logic are programmable.

8. The droop detector circuit of claim 7, wherein the plural delay lines and the logic are programmably configured to trigger on a constant voltage level for the voltage regulator output relative to ground.

9. The droop detector circuit of claim 7, wherein the plural delay lines and the logic are programmably configured to trigger on a percentage voltage level for the voltage regulator output relative to ground.

10. The droop detector circuit of claim 1, wherein the logic comprises a pair of D-type flip flops for each of the plural delay lines and a combinational logic circuit that receives a respective input from one of the D-type flip flops of each of the pairs.

11. The droop detector circuit of claim 1, wherein the logic comprises a pair of D-type flip flops for each of the plural delay lines and a combinational logic circuit that receives the input from one of flip flops of each of the pairs.

12. The droop detector circuit of claim 1, further comprising the voltage regulator.

13. The droop detector circuit of claim 1, wherein the plural delay lines are matched.

14. A droop detection method, comprising:
generating signals from a reference oscillator;
imposing phase delays in the signals received from the reference oscillator across plural delay lines; and
detecting droop in a voltage regulator based on receiving an output of the voltage regulator and outputs from each of the plural delay lines.

15. The droop detection method of claim 14, further comprising staggering the starts of the plural delay lines relative to the signals of the reference oscillator.

16. The droop detection method of claim 15, further comprising evaluating droop per respective clock period for each of the respective plural delay lines.

17. The droop detection method of claim 16, further comprising detecting sustained droop over the corresponding plural clock periods based on evaluating two or more of the plural delay lines.

18. The droop detection method of claim 14, further comprising evaluating a difference between the output (vdd) of the voltage regulator and ground (vss).

19. The droop detection method of claim 14, further comprising mitigating a presence of current surge by running the reference oscillator continuously for plural cycles associated with the delay lines.

20. The droop detection method of claim 14, further comprising programmably triggering detection based on either a constant voltage level for the voltage regulator output relative to ground or a percentage voltage level for the voltage regulator output relative to ground.

* * * * *